(12) United States Patent
Wang et al.

(10) Patent No.: US 12,261,179 B2
(45) Date of Patent: Mar. 25, 2025

(54) METHOD FOR PREPARING INTERLAYER INSULATING LAYER AND METHOD FOR MANUFACTURING THIN FILM TRANSISTOR, THIN FILM TRANSISTOR

(71) Applicant: BOE TECHNOLOGY GROUP CO., LTD., Beijing (CN)

(72) Inventors: Ming Wang, Beijing (CN); Ce Zhao, Beijing (CN); Wei Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 115 days.

(21) Appl. No.: 17/898,761

(22) Filed: Aug. 30, 2022

(65) Prior Publication Data

US 2022/0406822 A1    Dec. 22, 2022

Related U.S. Application Data

(63) Continuation of application No. 16/862,865, filed on Apr. 30, 2020, now Pat. No. 11,430,816.

(30) Foreign Application Priority Data

Aug. 8, 2019    (CN) .......................... 201910730276.8

(51) Int. Cl.
*H01L 27/12*    (2006.01)
*H01L 21/02*    (2006.01)
(Continued)

(52) U.S. Cl.
CPC .... *H01L 27/1248* (2013.01); *H01L 21/02164* (2013.01); *H01L 21/0217* (2013.01);
(Continued)

(58) Field of Classification Search
CPC ............ H01L 27/1244; H01L 29/7869; H01L 21/02271; H01L 21/02164; H01L 27/1225; H01L 21/02219
See application file for complete search history.

(56) References Cited

U.S. PATENT DOCUMENTS

2007/0087575 A1    4/2007    Iyer et al.
2017/0294456 A1*   10/2017   Lee ..................... H01L 27/1225
(Continued)

FOREIGN PATENT DOCUMENTS

CN    101006195 A    7/2007
CN    102021532 A    4/2011
(Continued)

OTHER PUBLICATIONS

Office Action dated Jan. 27, 2021 issued in corresponding Chinese Application No. 201910730276.8.
(Continued)

*Primary Examiner* — Brian Turner
(74) *Attorney, Agent, or Firm* — Nath, Goldberg & Meyer; Joshua B. Goldberg

(57) ABSTRACT

The present disclosure provides a method for preparing an interlayer insulating layer and a method for manufacturing a thin film transistor, and a thin film transistor, belongs to the field of display technology, and can solve the problem of poor resistance to breakdown of the interlayer insulating layer in the related art. The method for preparing an interlayer insulating layer includes the following steps: forming a silicon oxide layer with a first reaction gas and forming a silicon nitride layer with a second reaction gas such that hydrogen content in the silicon nitride layer is less than or equal to hydrogen content in the silicon oxide layer.

16 Claims, 3 Drawing Sheets

(51) Int. Cl.
*H01L 29/66* (2006.01)
*H01L 29/786* (2006.01)

(52) U.S. Cl.
CPC .. *H01L 21/02211* (2013.01); *H01L 21/02271* (2013.01); *H01L 27/1225* (2013.01); *H01L 27/1244* (2013.01); *H01L 27/1262* (2013.01); *H01L 29/66969* (2013.01); *H01L 29/7869* (2013.01)

(56) References Cited

U.S. PATENT DOCUMENTS

2018/0047753 A1* 2/2018 Yamazaki ........... H01L 27/0688
2018/0350995 A1* 12/2018 Kim .................... G09G 3/3266
2019/0148414 A1 5/2019 Cho et al.

FOREIGN PATENT DOCUMENTS

| | | |
|---|---|---|
| CN | 104094418 A | 10/2014 |
| CN | 104250724 A | 12/2014 |
| CN | 104271797 A | 1/2015 |
| CN | 107523800 A | 12/2017 |
| CN | 108028171 A | 5/2018 |
| CN | 108886059 A | 11/2018 |

OTHER PUBLICATIONS

Restriction Requirement dated Jun. 9, 2021 corresponding to U.S. Appl. No. 16/862,865.

Non-Final Office Action dated Sep. 27, 2021 corresponding to U.S. Appl. No. 16/862,865.

\* cited by examiner

METHOD FOR PREPARING INTERLAYER INSULATING LAYER AND METHOD FOR MANUFACTURING THIN FILM TRANSISTOR, THIN FILM TRANSISTOR

This is a continuation application of U.S. patent application Ser. No. 16/862,865, filed on Apr. 30, 2020, an application claiming the benefit to Chinese Application No. 201910730276.8, filed on Aug. 8, 2019 the content of each of which is hereby incorporated by reference in its entirety.

TECHNICAL FIELD

The present disclosure relates to the field of display technology, and particularly to a method for preparing an interlayer insulating layer, a method for manufacturing a thin film transistor and a thin film transistor.

BACKGROUND

In a large-sized organic light-emitting diode (OLED) display product, since thicknesses of a gate electrode and a metal layer are relatively large, an interlayer insulating layer therebetween is also relatively large. Currently, a thick interlayer insulating layer is generally formed by depositing two silicon oxide layers.

SUMMARY

The present disclosure provides a method for preparing an interlayer insulating layer, a method for manufacturing a thin film transistor and a thin film transistor.

The method for preparing an interlayer insulating layer includes steps of forming a silicon oxide layer and a silicon nitride layer; and the steps of forming a silicon oxide layer and a silicon nitride layer include: forming the silicon oxide layer with a first reaction gas and forming the silicon nitride layer with a second reaction gas such that hydrogen content in the silicon nitride layer is less than or equal to hydrogen content in the silicon oxide layer.

In an embodiment, the forming the silicon oxide layer with a first reaction gas includes: forming the silicon oxide layer by deposition with methylsilane and nitrous oxide.

In an embodiment, the forming a silicon nitride layer with the second reaction gas includes: forming the silicon nitride layer by deposition with trisilylamine and nitrogen.

In an embodiment, the hydrogen content in the silicon oxide layer is 1% to 2%; and the hydrogen content in the silicon nitride layer is 1% to 2%.

In an embodiment, the silicon nitride layer has a dielectric constant higher than that of the silicon oxide layer.

In an embodiment, the silicon oxide layer has a thickness of more than 2500 angstroms, and the silicon nitride layer has a thickness of more than 2500 angstroms.

The method for manufacturing a thin film transistor includes preparing an interlayer insulating layer, and the preparing an interlayer insulating layer includes steps of forming a silicon oxide layer and a silicon nitride layer; the steps of forming a silicon oxide layer and a silicon nitride layer include: forming the silicon oxide layer with a first reaction gas and forming the silicon nitride layer with a second reaction gas such that hydrogen content in the silicon nitride layer is less than or equal to hydrogen content in the silicon oxide layer.

In an embodiment, before preparing an interlayer insulating layer, the method further includes: sequentially forming an active layer, a gate insulating layer and a gate electrode on a substrate.

In an embodiment, the active layer includes an oxide active layer; and the preparing an interlayer insulating layer includes: sequentially forming the silicon oxide layer and the silicon nitride layer.

In an embodiment, after the preparing an interlayer insulating layer, the method further includes: forming a source electrode contact hole and a drain electrode contact hole which penetrate through the silicon oxide layer and the silicon nitride layer by a patterning process; and forming a source electrode and a drain electrode on the silicon nitride layer such that the source electrode is coupled to the active layer through the source electrode contact hole, and the drain electrode is coupled to the active layer through the drain electrode contact hole.

In an embodiment, the forming the silicon oxide layer with the first reaction gas includes: forming the silicon oxide layer by deposition with methylsilane and nitrous oxide.

In an embodiment, the forming the silicon nitride layer with the second reaction gas includes: forming the silicon nitride layer by deposition with trisilylamine and nitrogen.

The thin film transistor includes a substrate, and an active layer, a gate insulating layer, a gate electrode and an interlayer insulating layer sequentially arranged on the substrate, the interlayer insulating layer includes a silicon oxide layer and a silicon nitride layer; and hydrogen content in the silicon nitride layer is less than or equal to hydrogen content in the silicon oxide layer.

In an embodiment, the thin film transistor further includes a source electrode and a drain electrode, a source electrode contact hole and a drain electrode contact hole penetrating through the silicon oxide layer and the silicon nitride layer, and the source electrode is coupled to the active layer through the source electrode contact hole, and the drain electrode is coupled to the active layer through the drain electrode contact hole.

DETAILED DESCRIPTION OF THE EMBODIMENTS

In order to make a person skilled in the art better understand the technical solutions of the present disclosure, the following detailed description is given with reference to the accompanying drawings and the embodiments.

The inventors found that at least the following problems exist in the related art: the silicon oxide layer is high in hardness and low in dielectric constant, and is easy to break down due to voltages on the gate electrode and the metal layer, and therefore the display effect of a display product is affected.

Figure 1:
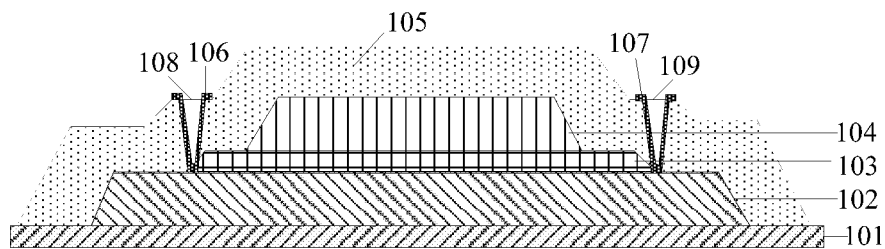
FIG. 1 is a schematic structural view of a top-gate thin film transistor in the related art.

The interlayer insulating layer provided in the embodiments of the present disclosure is mainly described in an example of a thin film transistor. The thin film transistor is generally a top-gate thin film transistor or a bottom-gate thin film transistor, and in the present embodiment, the top-gate thin film transistor is taken as an example for description. FIG. 1 is a schematic structural diagram of a top-gate thin film transistor, and as shown in FIG. 1, the top-gate thin film transistor includes: an active layer 102, a gate insulating layer 103, a gate electrode 104, an interlayer insulating layer 105, and a source and drain electrodes 106 and 107 disposed on the same layer, which are sequentially provided on the substrate 101, the source electrode 106 is coupled to the active layer 102 by a source electrode contact hole 108 penetrating the interlayer insulating layer 105, and the drain electrode 107 is coupled to the active layer 102 by a drain electrode contact hole 109 penetrating the interlayer insulating layer 105. In the related art, the interlayer insulating layer 105 may be composed of a composite layer having a double-layer structure of a silicon oxide layer and a silicon nitride layer, and the double-layer structure is generally prepared by chemical vapor deposition, low-temperature deposition, and the like. In the silicon nitride layer formed in the above manner, hydrogen atoms generally remain in the layer in the form of Si—H, Si—O or N—H bonds, and the hydrogen content has a great influence on the structure, stress, and corrosion resistance of the interlayer insulating layer 105, and at the same time, the hydrogen content has a great influence on the stability of the active layer 102. In order to solve the problem, at present, the interlayer insulating layer 105 is mainly prepared by depositing two silicon oxide layers, the hydrogen content in the reaction gas in the preparation process of the silicon oxide layers is low, so that the influence on the stability of the active layer 102 in the thin film transistor can be reduced, but the two silicon oxide layers are hard in texture and low in resistance to breakdown, and are easy to break down to cause short circuit in a practical application. This embodiment provides a method for preparing an interlayer insulating layer having a double-layer structure of a silicon oxide layer and a silicon nitride layer, and a method for manufacturing a thin film transistor including the interlayer insulating layer.

It should be noted herein that, the materials of the silicon oxide layer and the silicon nitride layer themselves do not contain hydrogen, and the hydrogen content in the silicon oxide layer or the hydrogen content in the silicon nitride layer in the embodiment of the present disclosure refer to the hydrogen content remaining in the layer as Si—H, Si—O or N—H bonds from the reaction gas used during the preparation of the layer.

Figure 2:
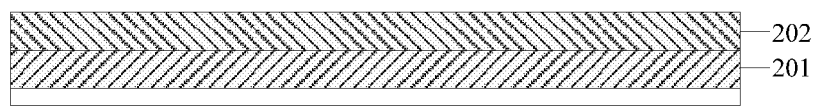
FIG. 2 is a schematic structural diagram of an interlayer insulating layer according to an embodiment of the disclosure.

According to an aspect of the present disclosure, a method for preparing an interlayer insulating layer is provided. FIG. 2 is a schematic structural diagram of an interlayer insulating layer according to an embodiment of the disclosure, and as shown in FIG. 2, the interlayer insulating layer is composed of a silicon oxide layer 201 and a silicon nitride layer 202. The method for preparing the interlayer insulating layer provided by the embodiment of the present disclosure can be used for preparing the interlayer insulating layer shown in FIG. 2. The method for preparing the interlayer insulating layer comprises the following steps: forming a silicon oxide layer with a first reaction gas and forming a silicon nitride layer with a second reaction gas such that the hydrogen content in the formed silicon nitride layer is less than or equal to the hydrogen content in the formed silicon oxide layer.

In the embodiment of the present disclosure, first, the silicon oxide layer 201 may be formed with the first reaction gas, and generally, the formed silicon oxide layer 201 contains a relatively low hydrogen content, which may reduce the influence of the hydrogen content in the entire interlayer insulating layer 105 on the stability of the active layer 102. Then, the silicon nitride layer 202 is formed on the silicon oxide layer 201 with the second reaction gas, the formed silicon nitride layer 202 also has a relatively low hydrogen content, and the hydrogen content in the formed silicon nitride layer 202 is less than or equal to the hydrogen content in the silicon oxide layer 201. It should be understood that, the hydrogen content in the formed silicon oxide layer 201 is generally low, and the hydrogen content in the silicon nitride layer 202 formed in the embodiment of the present disclosure is lower than the hydrogen content in the silicon oxide layer 201, so that the formed silicon nitride layer 202 can be ensured to contain a lower hydrogen content, and therefore the overall interlayer insulating layer 105 contains a relatively low hydrogen content, and further, the influence on the stability of the active layer 102 can be reduced. Meanwhile, due to the material characteristics of the silicon nitride layer 202, the silicon nitride layer is soft in texture, high in dielectric constant and high in resistance to breakdown, so that the resistance to breakdown of the overall interlayer insulating layer can be improved, the yield of the display products can be effectively improved, and the display effect of the display product can be further improved.

It should be understood that, the interlayer insulating layer 105 prepared by the method for preparing an interlayer insulating layer provided by the embodiment of the present disclosure includes the silicon oxide layer 201 and the silicon nitride layer 202, and may also include multiple silicon oxide layers 201 and multiple silicon nitride layers 202 formed alternately, and at least one of the two outermost layers of the entire interlayer insulating layer 105 is the silicon oxide layer 201. Of course, a sequence for preparing the silicon oxide layer 201 and the silicon nitride layer 202 may be selected according to actual requirements.

Figure 3:
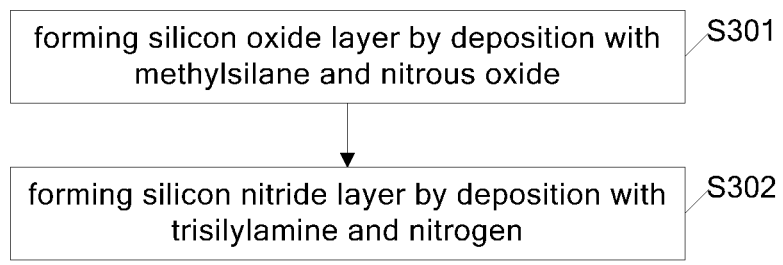
FIG. 3 is a flowchart of a method for preparing an interlayer insulating layer according to an embodiment of the disclosure.

In the embodiment of the present disclosure, the method for preparing an interlayer insulating layer is described by taking the interlayer insulating layer having a double-layer structure of a silicon oxide layer 201 and a silicon nitride layer 202 as an example. FIG. 3 is a flowchart of a method for preparing an interlayer insulating layer according to an embodiment of the present disclosure, and as shown in FIG. 3, the method for preparing an interlayer insulating layer includes the following steps:

S301, a silicon oxide layer is formed by deposition with methylsilane ($SiH_4$) and nitrous oxide ($N_2O$).

It should be noted that, methylsilane and nitrous oxide may be used as the first reaction gas, methylsilane and nitrous oxide gases may be fed into the reaction chamber at a temperature of 300 degrees centigrade (° C.) at corresponding flow rates, and in an environment at a pressure of 1.0 Torr, molecules of methylsilane and nitrous oxide gases are ionized into atoms by an electric field, and the atoms react with each other, thereby forming the silicon oxide layer by deposition. It is understood that, the flow rates at which methylsilane and the nitrous oxide are fed into the reaction chamber may be adjusted to form a uniform silicon oxide layer according to practical applications, and for example, the flow rates may be 1 to 100 slm (liters per minute), as in the related art, which is not limited herein. The residual hydrogen content in the silicon oxide layer 201 formed by deposition with methylsilane and nitrous oxide in the embodiment of the present disclosure is low, and the influence on the stability of the active layer 102 may be reduced.

S302, a silicon nitride layer is formed by deposition with Trisilylamine (TSA) and nitrogen.

It should be noted that, in the related art, the silicon nitride layer may be formed by chemical vapor deposition with three gases, i.e., methylsilane, ammonia, and nitrogen. However, in the procedure of forming the silicon nitride layer by deposition using the three gases, much hydrogen is easily introduced into the silicon nitride layer, so that a higher hydrogen content remains in the formed silicon nitride layer, and will affect the stability of the active layer 102. In order to reduce the hydrogen content in the formed silicon nitride layer 202, trisilylamine and nitrogen may be used in the embodiment of the present disclosure, and trisilylamine and nitrogen gases may be introduced into the reaction chamber at a temperature of 200 to 350° C. (e.g., 250° C.), trisilylamine gas may be introduced at a flow rate of 3 slm (liters per minute) to 9 slm and nitrogen may be introduced at a flow rate of 0.1 slm to 6 slm, and molecules of trisilylamine and nitrogen gases are ionized into atoms by an electric field in an environment at a pressure of 2 to 4 torr (e.g., 3 torr), and the atoms react with each other, thereby forming the silicon nitride layer 202. As known to those skilled in the art, the above-mentioned temperature, flow rates of the gases, pressure and electric field strength may be selected according to the size of the reaction chamber and the thickness and quality requirements of the silicon nitride layer to be formed. It is understood that, the flow rates of trisilylamine and nitrogen gases may be adjusted to form a uniform silicon nitride layer 202. In the embodiment of the present disclosure, the silicon nitride layer 202 formed by deposition with trisilylamine and nitrogen has a relatively low hydrogen content than the silicon nitride layer formed by deposition with methylsilane, ammonia, and nitrogen in the related art, and the influence on the stability of the active layer 102 can be reduced by the silicon nitride layer 202 formed by the method provided in the embodiment of the present disclosure. Meanwhile, the formed silicon nitride layer 202 is soft in texture, high in dielectric constant and high in resistance to breakdown, so that the resistance to breakdown of the entire interlayer insulating layer 105 can be improved, and the yield of display products can be improved. The chemical structure of trisilylamine is as follows:

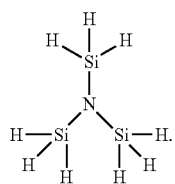

It should be noted that, the sequence to perform steps S301 and S302 is related to the application scenario of the interlayer insulating layer. For example, when an oxide thin film transistor is formed, the interlayer insulating layer is formed after an oxide active layer is formed. Therefore, step S301 needs to be performed first to form a silicon oxide layer, and then step S302 needs to be performed to form a silicon nitride layer. If the interlayer insulating layer is formed before the oxide active layer is formed, step S302 needs to be performed first to form a silicon nitride layer, and step S301 is then performed to form a silicon oxide layer.

Alternatively, the hydrogen content (atomic percent of hydrogen) in the silicon oxide layer is 1% to 2%; the hydrogen content (atomic percent of hydrogen) in the silicon nitride layer is 1% to 2%. Optionally, the refractive index (RI) of the silicon nitride layer reflecting the stress characteristics ranges between 2.0 and 2.1.

Figure 4:
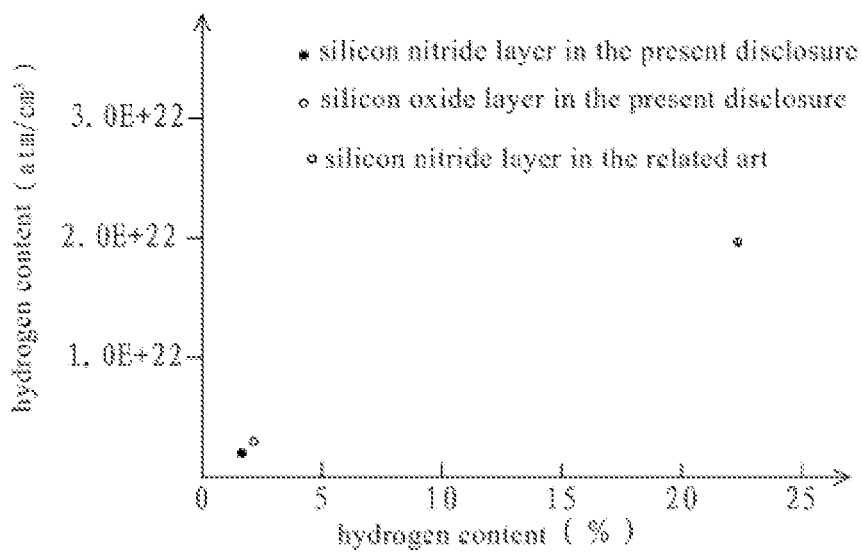
FIG. 4 is a diagram illustrating results of testing hydrogen content in a silicon nitride layer and hydrogen content in a silicon oxide layer prepared according to an embodiment of the present disclosure and hydrogen content in a silicon nitride layer prepared in the related art.

In an embodiment, FIG. 4 is a diagram illustrating results of testing hydrogen content in the formed layers according to an embodiment of the present disclosure. As shown in FIG. 4, the hydrogen content in the silicon nitride layer 202 formed with trisilylamine and nitrogen is 1.8%, the hydrogen content in the silicon oxide layer 201 formed with methylsilane and nitrous oxide is 1.9%, and the hydrogen content in the silicon nitride layer formed with methylsilane, ammonia and nitrogen in the related art is 22%. Therefore, it can be seen that, the silicon oxide layer 201 and the silicon nitride layer 202 formed with the method provided by the embodiment of the present disclosure have lower hydrogen contents, and therefore, the overall interlayer insulating layer 105 has lower hydrogen content, and the influence on the stability of the active layer 102 can be reduced.

Optionally, the dielectric constant of the silicon nitride layer 202 is higher than that of the silicon oxide layer 201.

It should be noted that, the dielectric constant is an important parameter for characterizing the electrical properties of a dielectric or insulating material, and the higher the dielectric constant of the layer material is, the stronger the resistance to breakdown thereof is. In the embodiment of the present disclosure, the dielectric constant of the silicon nitride layer 202 is higher than that of the silicon oxide layer 201, so that the silicon nitride layer with a higher dielectric constant can improve the resistance to breakdown of the entire interlayer insulating layer 105, thereby improving the yield of the display products.

Optionally, the thickness of the silicon oxide layer 201 is greater than 2500 angstroms, and the thickness of the silicon nitride layer 202 is greater than 2500 angstroms.

It should be noted that, the double-layer or multi-layer structure formed by the silicon oxide layer 201 and the silicon nitride layer 202 may constitute a thicker overall interlayer insulating layer 105 to achieve a good insulating effect, so as to prevent the interlayer insulating layer 105 from being broken down by the electric field formed on both sides. The interlayer insulating layer 105 generally has a thickness of greater than 5000 angstroms, the silicon oxide layer may be greater than 2500 angstroms thick, and the silicon nitride layer may be greater than 2500 angstroms thick. The interlayer insulating layer 105 having a multi-layer structure in which the silicon oxide layer 201 and the silicon nitride layer 202 are alternately arranged may be formed as needed. It is understood that, the silicon oxide layer 201 and the silicon nitride layer 202 may have other thicknesses in practical applications.

Figure 5:
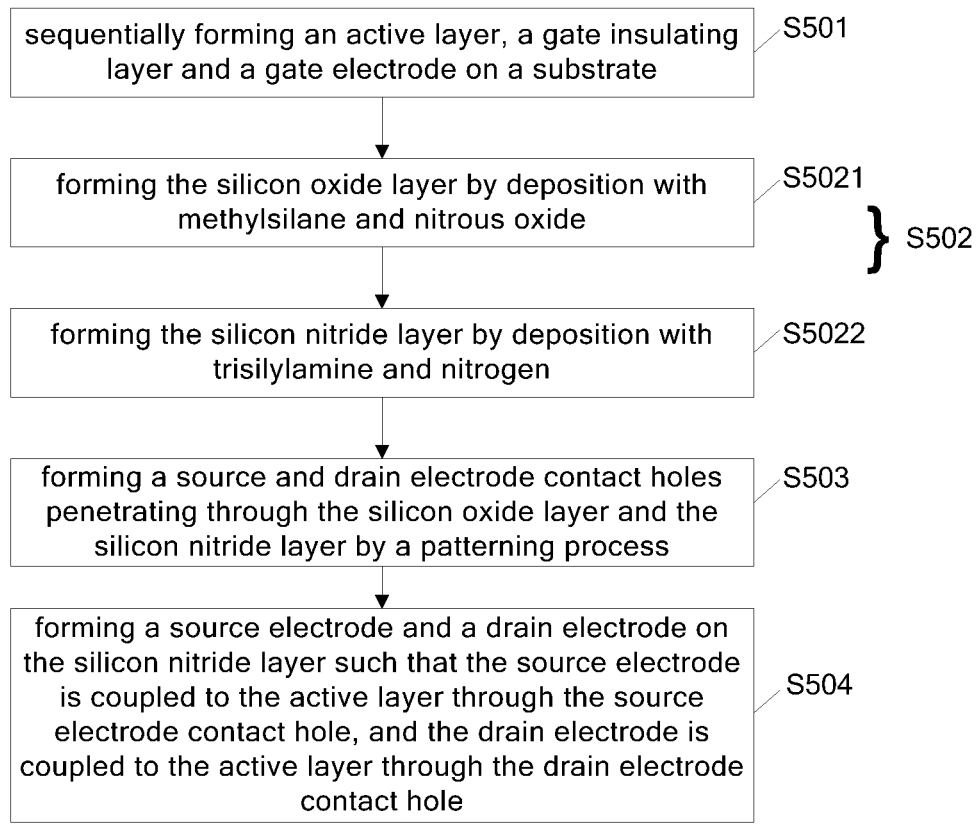
FIG. 5 is a flowchart of a method for manufacturing a thin film transistor according to an embodiment of the present disclosure.

According to another aspect of the present disclosure, a method for manufacturing a thin film transistor is provided, and this embodiment will take a top-gate thin film transistor as an example, and further describe in detail the method for manufacturing a thin film transistor provided in the present disclosure with reference to the accompanying drawings. The interlayer insulating layer 105 is a double-layer structure formed by the method for preparing an interlayer insulating layer provided in the above embodiments. FIG. 5 is a flowchart of a method for manufacturing a thin film transistor according to an embodiment of the present disclosure, and as shown in FIG. 5, the method for manufacturing a thin film transistor includes the following steps (where steps S5021 and S5022 are steps of the method for preparing an interlayer insulating layer as shown in FIG. 3):

Step S501, an active layer, a gate insulating layer and a gate electrode are sequentially formed on a substrate.

Figure 6A:
FIG. 6a to FIG. 6g are schematic diagrams illustrating a method for manufacturing a thin film transistor according to an embodiment of the present disclosure.
Figure 6B:
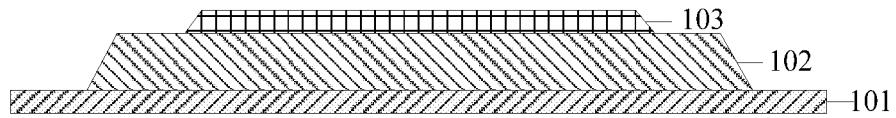
Figure 6C:
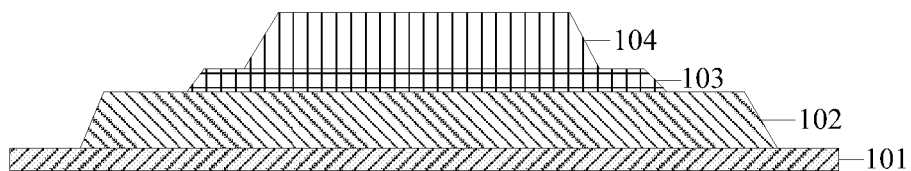

In step S501, patterns of the active layer 102, the gate insulating layer 103, and the gate electrode 104 may be formed on the substrate 101 by a single patterning process. For example, the substrate 101 may be initially cleaned during the preparation process, and as shown in FIG. 6a, a material layer of the active layer 102 may be deposited on the substrate 101. A material of the active layer 102 may be a semiconductor material, and for example may be a metal oxide material such as indium zinc oxide or indium tin oxide. Then, as shown in FIG. 6b, a material layer of the gate insulating layer 103 is deposited to at least cover the active layer 102. The gate insulating layer 103 may be a silicon oxide layer to insulate the active layer 102 from the gate electrode 104 thereon, thereby preventing a voltage on the gate electrode 104 from affecting the active layer 102. Finally, as shown in FIG. 6c, a metal layer of the gate electrode 104 is deposited on the gate insulating layer 103, and a photoresist layer is coated on the metal layer of the gate electrode 104. The gate electrode 104 may be made of a conductor such as copper, and the active layer 102, the gate insulating layer 103 and the gate electrode 104 may be patterned by performing exposure, development, post-baking, etching, and photoresist stripping processes on the metal layer of the gate electrode 104.

Step S502, an interlayer insulating layer consisting of a silicon oxide layer and a silicon nitride layer is formed on the gate electrode.

In step S502, a silicon oxide layer and a silicon nitride layer are deposited on the gate electrode 104, and the interlayer insulating layer 105 having a double-layer structure including the silicon oxide layer 201 and the silicon nitride layer 202 is formed. When the thin film transistor is an oxide thin film transistor, the active layer 102 includes an oxide active layer, which may comprise metal oxide such as indium zinc oxide or indium tin oxide. When the thin film transistor is an oxide thin film transistor, the step S502 may include the following sub-steps:

Sub-step S5021, a silicon oxide layer is formed by deposition with methylsilane and nitrous oxide.

Figure 6D:
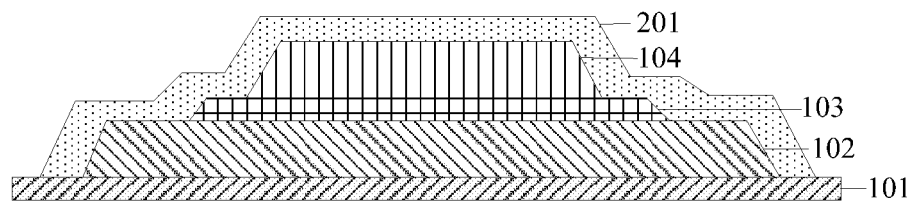

Particularly, as shown in FIG. 6d, a silicon oxide layer 201 may be deposited on the gate electrode 104 using methylsilane and nitrous oxide as the first reaction gas, and the silicon oxide layer 201 formed with methylsilane and nitrous oxide has a relatively low hydrogen content, which may reduce the influence on the stability of the oxide active layer.

Sub-step S5022, a silicon nitride layer is formed by deposition with Trisilylamine (TSA) and nitrogen.

Figure 6E:
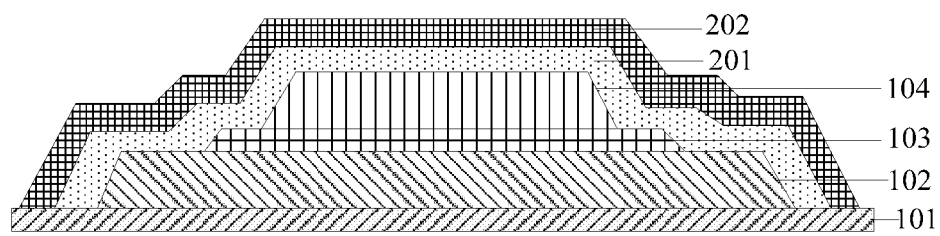

Particularly, as shown in FIG. 6e, a silicon nitride layer 202 may be deposited on the silicon oxide layer 201 using trisilylamine and nitrogen as the second reaction gas, and the hydrogen content in the silicon nitride layer 202 formed with trisilylamine and nitrogen is low, which may reduce the influence on the stability of the oxide active layer. Meanwhile, the formed silicon nitride layer 202 has a relatively soft texture, a relatively high dielectric constant, and a relatively high resistance to breakdown, so that the resistance to breakdown of the entire interlayer insulating layer 105 can be improved.

When the thin film transistor is an oxide thin film transistor, the sequence to perform the sub-steps S502021 and S52 is first performing the sub-step S5021 to form the silicon oxide layer covering the gate electrode 104, and then performing the sub-step S5022 to form the silicon nitride layer 202 on the silicon oxide layer 201.

Step S503, a source electrode contact hole and a drain electrode contact hole penetrating through the silicon oxide layer and the silicon nitride layer are formed by a patterning process.

Figure 6F:
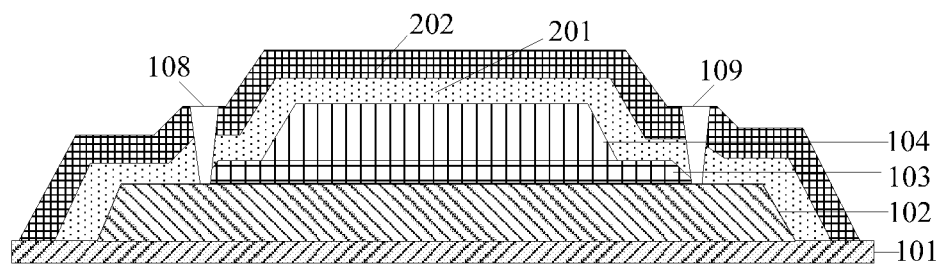

Particularly, as shown in FIG. 6f, a photoresist layer is coated on the silicon nitride layer 202, and after exposure, development and post-baking processes are performed on the photoresist layer, an etching process is performed on the silicon oxide layer 201 and the silicon nitride layer 202 in the interlayer insulating layer 105, and then the photoresist layer is stripped off, such that the source electrode contact hole 108 corresponding to the source electrode 106 and the drain electrode contact via hole 109 corresponding to the drain electrode 107 are formed.

Step S504, a source electrode and a drain electrode are formed on the silicon nitride layer such that the source electrode is coupled to the active layer through the source electrode contact hole, and the drain electrode is coupled to the active layer through the drain electrode contact hole.

Figure 6G:
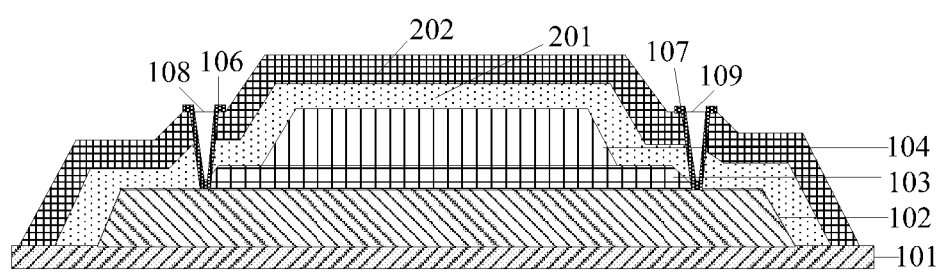

Particularly, as shown in FIG. 6g, a source electrode 106 and a drain electrode 107 are deposited on the silicon nitride layer 202, and both the source electrode 106 and the drain electrode 107 each are a metal layer and made of a conductive metal material. The source electrode 106 may be coupled to the active layer 102 through the source electrode contact hole 108 penetrating the silicon oxide layer 201 and the silicon nitride layer 202, and the drain electrode 107 may be coupled to the active layer 102 through the drain electrode contact hole 109 penetrating the silicon oxide layer 201 and the silicon nitride layer 202. Therefore, the thin film transistor is completed. Gate lines and data lines (not shown) may be previously formed in the thin film transistor to facilitate wiring when the thin film transistor is applied to an array substrate. The gate line and the gate electrode 104 may be disposed in a same layer, and the gate line and the gate electrode 104 are electrically coupled to each other, and may be made of a same material and formed by a single patterning process. The data line is disposed in a same layer as the source electrode 106, and the data line and the source electrode 106 are electrically coupled to each other, and may be formed of a same material and formed by a single patterning process. A gate voltage may be inputted to the gate electrode 104 through the gate line, a data voltage may be inputted to the source electrode 106 through the data line, and the interlayer insulating layer 105 between the gate electrode 104 and the source electrode 106 may insulate the gate electrode 104 from the source electrode 106 to prevent a short circuit. In the embodiment of the present disclosure, the silicon nitride layer 202 can improve the resistance to breakdown of the entire interlayer insulating layer 105, and avoid the breakdown of the entire interlayer insulating layer 105 due to the electric field between the gate electrode 104 and the source electrode 106 or the drain electrode 107, thereby improving the yield of the display products and further improving the display effect. Meanwhile, the hydrogen content in the formed silicon oxide layer 201 and the silicon nitride layer 202 is low, so that the influence of the hydrogen content in the entire interlayer insulating layer 105 on the stability of the active layer 102 can be avoided.

It will be understood that, the above embodiments are merely exemplary embodiments employed to illustrate the principles of the present disclosure, and the present disclosure is not limited thereto. It will be apparent to those skilled

What is claimed is:

1. A thin film transistor, comprising a substrate, and an oxide active layer, a gate insulating layer, a gate electrode, an interlayer insulating layer, a source electrode and a drain electrode sequentially arranged on the substrate, wherein
the oxide active layer comprises a source contact region in contact with the source electrode and a drain contact region in contact with the drain electrode;
the gate insulating layer and the gate electrode only cover a part of the oxide active layer and expose the source contact region and the drain contact region of the oxide active layer;
the interlayer insulating layer covers an exposed part of the substrate, an exposed part of the oxide active layer, and an exposed part of the gate electrode; the interlayer insulating layer further comprises a source contact hole and a drain contact hole, at positions respectively corresponding to the source contact region and the drain contact region of the oxide active layer, extending through the interlayer insulating layer; and a sidewall of the source contact hole and a sidewall of the drain contact hole are respectively adjacent to the gate electrode and are spaced apart from the gate electrode by a part of the interlayer insulating layer; and
the source electrode and the drain electrode extend through the source contact hole and the drain contact hole to be in contact with the source contact region and the drain contact region, respectively;
wherein the interlayer insulating layer comprises at least one silicon oxide layer and at least one silicon nitride layer;
hydrogen content in the silicon nitride layer is less than or equal to hydrogen content in the silicon oxide layer;
the hydrogen content in the silicon nitride layer is 1% to 2%; and
the hydrogen content in the silicon oxide layer is 1% to 2%.

2. The thin film transistor according to claim 1, wherein the at least one silicon oxide layer and the at least one silicon nitride layer are sequentially and alternately arranged on the substrate; and
one of the at least one silicon oxide layer covers the source contact region and the drain contact region of the oxide active layer.

3. The thin film transistor according to claim 1, wherein the hydrogen content in the silicon nitride layer is 1.8% to 2%.

4. The thin film transistor according to claim 1, wherein the hydrogen content in the silicon oxide layer is 1.9%; and the hydrogen content in the silicon nitride layer is 1.8%.

5. The thin film transistor according to claim 3, wherein a refractive index of the silicon nitride layer is in a range between 2.0 and 2.1.

6. The thin film transistor according to claim 3, wherein the silicon oxide layer has a thickness of more than 2500 angstroms, and the silicon nitride layer has a thickness of more than 2500 angstroms.

7. The thin film transistor according to claim 3, wherein the silicon nitride layer has a dielectric constant higher than that of the silicon oxide layer.

8. The thin film transistor according to claim 3, wherein the silicon nitride layer has a higher hardness than the silicon oxide layer.

9. A method for manufacturing a thin film transistor, comprising:
forming an oxide semiconductor layer on a substrate and performing a patterning process on the oxide semiconductor layer to form an oxide active layer, such that the oxide active layer comprises a source contact region in contact with a source electrode of the thin film transistor and a drain contact region in contact with a drain electrode of the thin film transistor;
forming a gate insulating layer and a gate electrode on the substrate, such that the gate insulating layer and the gate electrode only cover a part of the oxide active layer and expose the source contact region and the drain contact region of the oxide active layer;
forming an interlayer insulating layer on the substrate to cover an exposed part of the substrate, an exposed part of the oxide active layer, and an exposed part of the gate electrode;
forming a source contact hole and a drain contact hole, at positions respectively corresponding to the source contact region and the drain contact region of the oxide active layer, such that the source contact hole and the drain contact hole extend through the interlayer insulating layer, a sidewall of the source contact hole and a sidewall of the drain contact hole are respectively adjacent to the gate electrode and are spaced apart from the gate electrode by a part of the interlayer insulating layer; and
forming a metal layer on the interlayer insulating layer and performing a patterning process on the metal layer to form the source electrode and the drain electrode, such that the source electrode and the drain electrode extend through the source contact hole and the drain contact hole to be in contact with the source contact region and the drain contact region, respectively;
wherein the interlayer insulating layer comprises at least one silicon oxide layer and at least one silicon nitride layer;
hydrogen content in the silicon nitride layer is less than or equal to hydrogen content in the silicon oxide layer;
the hydrogen content in the silicon nitride layer is 1% to 2%; and
the hydrogen content in the silicon oxide layer is 1% to 2%.

10. The method for manufacturing a thin film transistor according to claim 9, wherein
the forming the interlayer insulating layer comprises:
forming at least one silicon oxide layer and forming at least one silicon nitride layer sequentially and alternately on the substrate.

11. The method for manufacturing a thin film transistor according to claim 10, wherein the forming at least one silicon oxide layer comprises depositing methylsilane and nitrous oxide to form a silicon oxide layer, such that the silicon oxide layer covers the source contact region and the drain contact region of the oxide active layer and the gate electrode; and
the forming at least one silicon nitride layer comprises depositing trisilylamine and nitrogen to form a silicon nitride layer on the silicon oxide layer such that the silicon nitride layer covers the silicon oxide layer.

12. The method for manufacturing a thin film transistor according to claim 9, wherein the hydrogen content in the silicon nitride layer is 1.8% to 2%.

13. The method for manufacturing a thin film transistor according to claim 12, wherein the hydrogen content in the silicon oxide layer is 1.9%; and the hydrogen content in the silicon nitride layer is 1.8%.

14. The method for manufacturing a thin film transistor according to claim 12, wherein a refractive index of the silicon nitride layer is in a range between 2.0 and 2.1.

15. The method for manufacturing a thin film transistor according to claim 12, wherein the silicon oxide layer has a thickness of more than 2500 angstroms, and the silicon nitride layer has a thickness of more than 2500 angstroms.

16. The method for manufacturing a thin film transistor according to claim 12, wherein the silicon nitride layer has a dielectric constant higher than that of the silicon oxide layer.

* * * * *